United States Patent [19]

Yoshimoto et al.

[11] Patent Number: 5,010,519
[45] Date of Patent: Apr. 23, 1991

[54] DYNAMIC SEMICONDUCTOR MEMORY DEVICE FORMED BY 2-TRANSISTOR CELLS

[75] Inventors: Masahiko Yoshimoto; Tetsuya Matsumura, both of Hyogo, Japan

[73] Assignee: Mitsubishi Denki Kabushiki Kaisha, Tokyo, Japan

[21] Appl. No.: 267,328

[22] Filed: Nov. 4, 1988

[30] Foreign Application Priority Data

Nov. 17, 1987 [JP] Japan .................. 62-291345
Dec. 14, 1987 [JP] Japan .................. 62-317807

[51] Int. Cl.$^5$ .............................................. G11C 11/40
[52] U.S. Cl. ................................ 365/149; 365/230.06
[58] Field of Search ............ 365/149, 189.01, 189.09, 365/230.01, 230.06

[56] References Cited

U.S. PATENT DOCUMENTS 4,044,340  8/1977  Itoh .

FOREIGN PATENT DOCUMENTS 0045020  3/1982  European Pat. Off. .
0055339  7/1982  European Pat. Off. .

OTHER PUBLICATIONS

"Introduction to NMOS and CMOS VLSI System Design", pp. 268-273.
K. L. Anderson, "Shared Bit Line Sensing for Two-Device Cell", IBM Technical Disclosure Bulletin, vol. 20, No. 11A, (Apr. 1978), pp. 4295-4296.

Primary Examiner—Terrell W. Fears
Attorney, Agent, or Firm—Lowe, Price, LeBlanc, Becker & Shur

[57] ABSTRACT

An FIFO memory comprises two-transistor type memory cells. Each of the memory cells comprises a first transistor, a second transistor and storage capacitance. The storage capacitance is connected to a first bit line through the first transistor and connected to a second bit line through the second transistor. The first transistor has its gate connected to a first word line, and the second transistor has its gate connected to a second word line. Data is written or read out through the first transistor, and data is read out or written through the second transistor.

25 Claims, 14 Drawing Sheets

F I G. 7
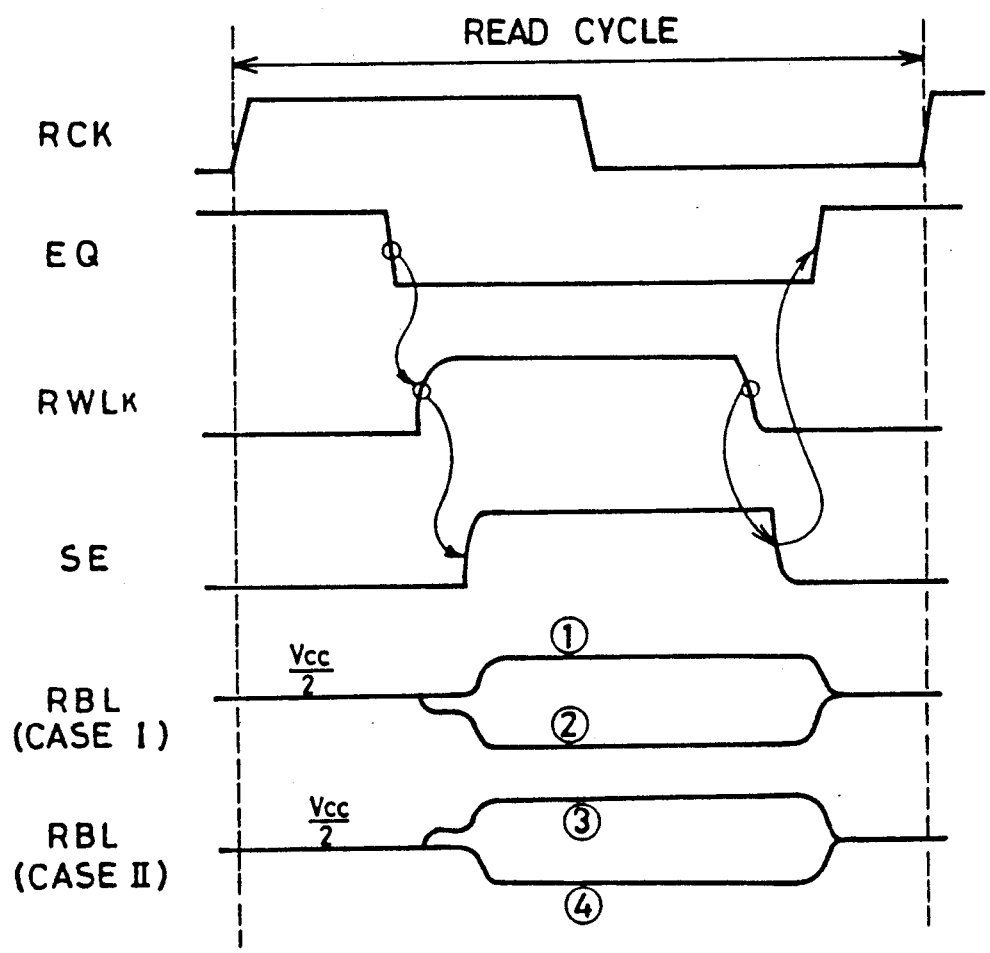

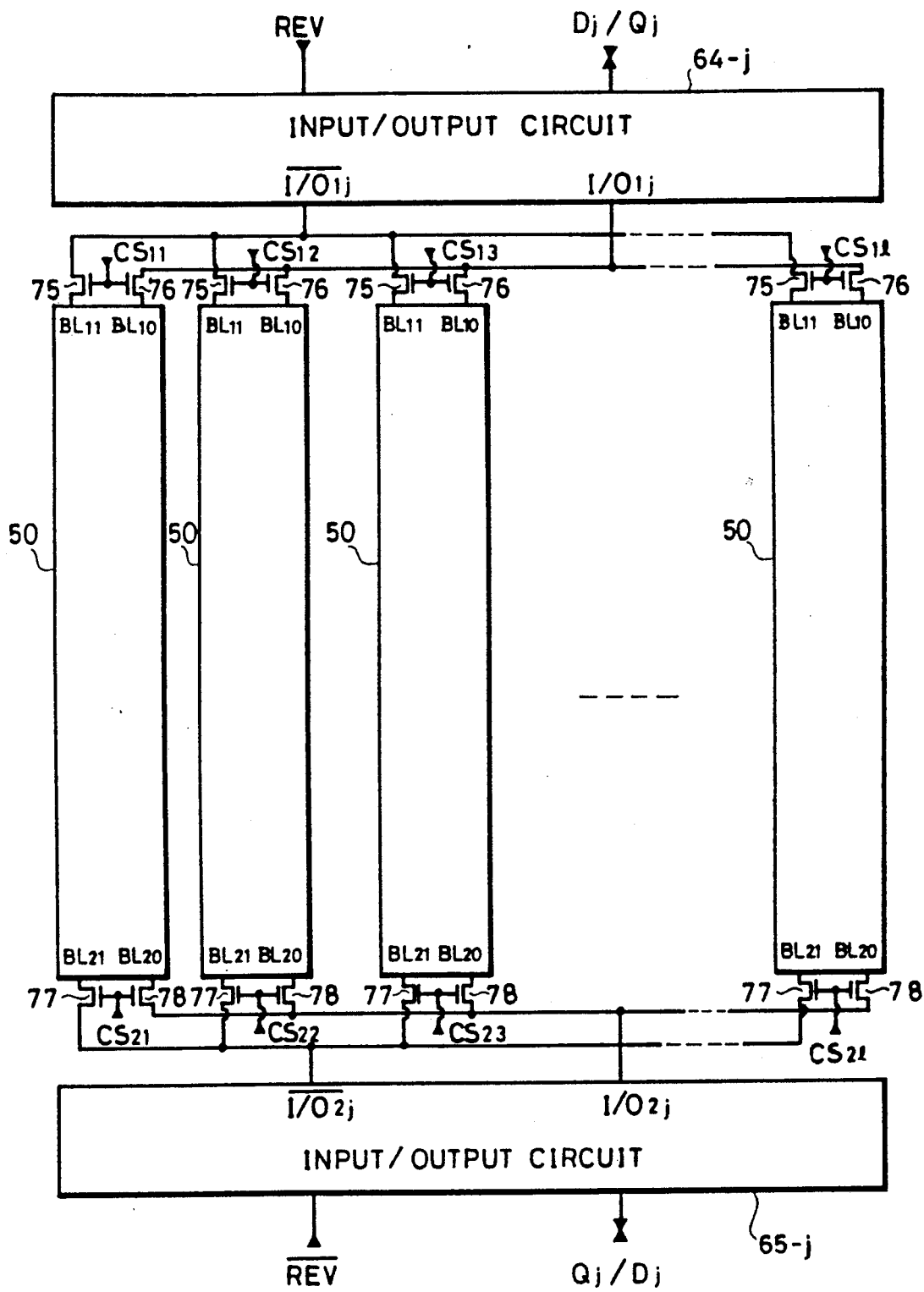

DYNAMIC SEMICONDUCTOR MEMORY DEVICE FORMED BY 2-TRANSISTOR CELLS

BACKGROUND OF THE INVENTION

1. Field of the Invention

The present invention relates generally to dynamic semiconductor memory devices having a small area occupied thereby and more particularly, to a semiconductor memory device comprising two-transistor type memory cells.

2. Description of the Prior Art

FIG. 1 is a circuit diagram showing a conventional three-transistor type memory cell used in an FIFO (first in first out) memory from which data first inputted thereto is first read out, or the like.

The memory cell comprises a data storing transistor 1, a data writing transistor 2, a data reading transistor 3 and storage capacitance 4. An n channel MOS field effect transistor is used as the transistors 1, 2 and 3. In the memory cell, information "1" and "0" are represented depending on presence/absence of charges in the storage capacitance 4. The data storing transistor 1 has its gate connected to a write data bit line 5 through a source and a drain of the data writing transistor 2. The data writing transistor 2 has its gate connected to a write selecting line 6. The data writing transistor 2 serves as a write gate. In addition, the data storing transistor 1 has its source connected to a read data bit line 7 through a source and a drain of the data reading transistor 3. The data reading transistor 3 has its gate connected to a read selecting line 8. The data reading transistor 3 serves as a read gate.

Description is now made on an operation of the memory cell. The read data bit line 7 is generally precharged to a positive potential $V_{PR}$. The write selecting line 6 and the read selecting line 8 are generally held at a zero potential. At the time of a write operation, the write selecting line 6 is held at the positive potential and the read selecting line 8 is held at the zero potential. It is assumed that information "1" is written. In this case, if the write data bit line 5 is held at a predetermined positive potential, the potential is transmitted to the data storing transistor 1 through the data writing transistor 2, so that the storage capacitance 4 is charged.

In addition, it is assumed that information "0" is written. In this case, if a write data bit line 5 is held at a zero potential, the zero potential is transmitted to the data storing transistor 1 through the data writing transistor 2, so that the storage capacitance 4 is discharged.

Thereafter, the write selecting line 6 is returned to the zero potential, so that the information "1" or "0" is held in a memory cell 9. Since the storage capacitance 4 is discharged or charged due to a leakage current such as a subthreshold current of the data writing transistor 2 so that the information gradually disappears, the storage capacitance 4 must be refreshed or data must be read out within a constant time period.

At the time of a read operation, the read selecting line 8 is held at the positive potential and the write selecting line 6 is held at the zero potential. If and when information "1" is stored in the memory cell 9 so that the storage capacitance 4 is charged to the positive potential, the read data bit line 7 which is precharged in advance to the positive potential $V_{PR}$ is discharged to the zero potential through the data reading transistor 3 and the data storing transistor 1. On the other hand, if information "0" is stored in the memory cell 9 so that a potential of the storage capacitance 4 is the zero potential, the data storing transistor 1 is rendered non-conductive, so that the read data bit line 7 remains at the precharge potential $V_{PR}$. Thus, information stored in the memory cell 9 can be known by examining the potential on the read data bit line 7.

FIG. 2 illustrates an example of a circuit for precharging the read data bit line 7 and a sense amplifier circuit for amplifying the potential on the read data bit line 7.

When a precharging signal PC applied to a gate of a precharging transistor 101 rises to an "H" level, the transistor 101 is rendered conductive, so that the read data bit line 7 is precharged to a power-supply potential $V_{CC}$. When information is read out to the read data bit line 7 from the memory cell, an output of an inverter 102 attains the "H" or "L" level depending on the potential on the read data bit line 7. When a sense enable signal SE applied to a gate of a transistor 103 rises to the "H" level, the output of the inverter 102 is held in a latch circuit comprising inverters 104 and 105.

A semiconductor memory device using three-transistor type memory cells is described in, for example, "Introduction to nMOS and CMOS VLSI System Design", pp. 268-273.

Since a memory cell included in the conventional semiconductor memory device is structured as described above, four devices (3Tr, 1C) are required for every memory cell. Consequently, the cell size is increased, which is not suitable for increasing capacity of the semiconductor memory device.

Furthermore, in the FIFO memory employing the above describe memory cell, data can be transferred only in one direction, so that two FIFO memories must be employed when data is transferred in both directions among a plurality of systems.

SUMMARY OF THE INVENTION

One object of the invention is to provide a semiconductor memory device having an increased integration density.

Another object of the invention is to provide a semiconductor memory device that is symmetrical for transferring information in both directions.

Another object is to provide a semiconductor memory device comprising memory cells that occupy a small amount of surface area of a substrate.

A further object of the invention is to provide a semiconductor memory device having increased operating speed.

Another object is to provide a semiconductor memory device that requires a reduced amount of operating current.

A further object is to provide a semiconductor memory device wherein bit line and word line capacitances are reduced to improve operating speed and minimize current consumption.

A still further object of the invention is to provide a DRAM formed of cells that require a minimum amount of substrate surface area.

Another object is to provide a FIFO memory formed of cells that require a minimum amount of substrate surface area.

A further object is to provide memory cells formed of a reduced number of components and to implement said cells into a DRAM or FIFO memory.

Another object of the invention is to provide a semiconductor memory device, wherein writing into and reading from each cell is independent and bidirectional.

In order to attain the above described object, a dynamic semiconductor memory device having a small occupied area comprises at least one memory cell for storing information, at least one first bit line connected to the memory cell, and at least one second bit line connected to the memory cell, the memory cell comprising capacitance means for storing the information, first transferring means connected between the first bit line and the capacitance means for transferring information between the first bit line and the capacitance means, and second transferring means connected between the second bit line and the capacitance means for transferring information between the second bit line and the capacitance means.

In accordance with another aspect of the present invention, a dynamic semiconductor memory device having a small occupied area comprises a plurality of memory cells arranged in at least one column for storing information, at least one write bit line provided corresponding to each column of the plurality of memory cells, at least one read bit line provided corresponding to each column of the plurality of memory cells, a plurality of first selecting lines each provided corresponding to each of the memory cells in each column, a plurality of second selecting lines each provided corresponding to each of the memory cells in each column, write selecting means for applying a write selecting signal to any of the plurality of first selecting lines, and read selecting means for applying a read selecting signal to any of the plurality of second selecting lines, each of the memory cells comprising capacitance means for storing information, a first transistor connected between the write bit line and the capacitance means and responsive to the write selecting signal applied to corresponding one of the first selecting lines for transferring information applied through the write bit line to the capacitance means, and a second transistor connected between the read bit line and the capacitance means and responsive to the read selecting signal applied to corresponding one of the second selecting line for transferring information stored in the capacitance means to the read bit line.

In accordance with still another aspect of the present invention, a dynamic semiconductor memory device having a small occupied area comprises a plurality of memory cells arranged in at least one column for storing information, at least one first bit line provided corresponding to each column of the plurality of memory cells, at least one read bit line provided corresponding to each column of the plurality of memory cells, first inputting/outputting means for inputting and outputting information through the first bit line, second inputting/outputting means for inputting and outputting information through the second bit line, a plurality of first selecting lines each provided corresponding to each of the memory cells in each column, a plurality of second selecting lines each provided corresponding to each of the memory cells in each column, first selecting means for applying a first selecting signal to any of the plurality of first selecting lines, and second selecting means for applying a second selecting signal to any of the plurality of second selecting lines, each of the memory cells comprising capacitance means for storing information, a first transistor connected between the first bit line and the capacitance means and responsive to the first selecting signal applied to corresponding one of the first selecting lines for transferring information between the first bit line and the capacitance means, and a second transistor connected between the second bit line and the capacitance means and responsive to the second selecting signal applied to corresponding one of the second selecting lines for transferring information between the second bit line and the capacitance means.

Each of the memory cells included in the semiconductor memory device according to the present invention comprises two transistors and one capacitance means, so that the cell size is decreased. Thus, a large capacity semiconductor memory device can be structured.

Additionally, in each of the memory cells, the first transistor and the second transistor are structured to be symmetrical with respect to the capacitance means, so that information can be written and read out through the first bit line and information can be written and read out through the second bit line. Thus, a semiconductor memory device capable of transferring information on both directions can be structured.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a timing chart for explaining a read operation of the FIFO memory shown in FIG. 4;

FIG. 14 is a circuit diagram showing structure of a portion connected to a single input/output circuit shown in FIG. 12A and a single input/output circuit shown in FIG. 12B;

DESCRIPTION OF THE PREFERRED EMBODIMENTS

Figure 1:
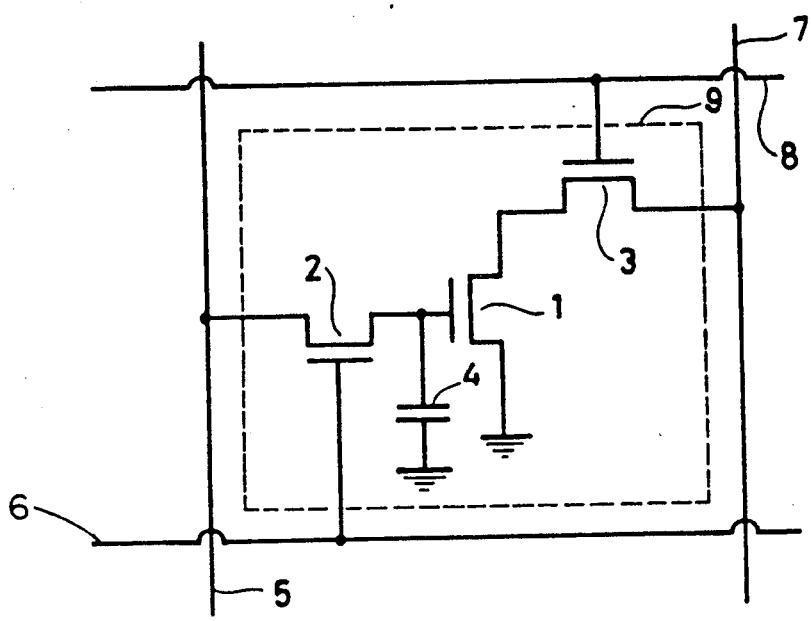
FIG. 1 is a circuit diagram showing a memory cell included in a conventional semiconductor memory device.

Referring now to the drawings, embodiments of the present invention will be described.

Figure 3:
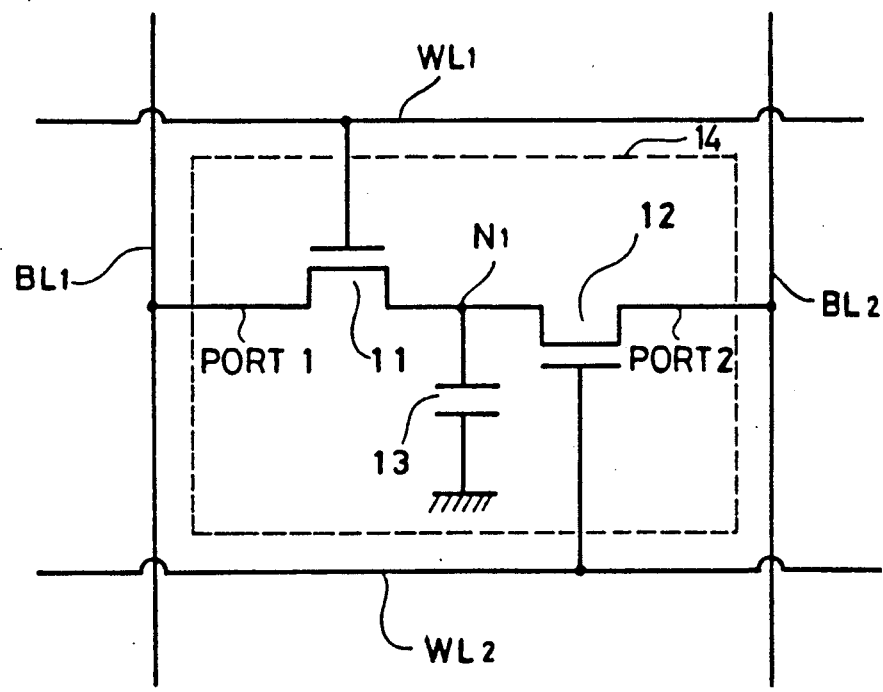
FIG. 3 is a circuit diagram showing a memory cell included in a semiconductor memory device according to an embodiment of the present invention.

FIG. 3 is a circuit diagram showing a memory cell included in an FIFO memory according to an embodiment of the present invention. The memory cell comprises a first transistor 11, a second transistor 12 and storage capacitance 13. An n channel MOS field effect transistor (MOSFET) is used as the transistors 11 and 12. A source (or drain) of the first transistor 11, a source (or drain) of the second transistor 12 and one end of the storage capacitance are connected to each other at a node N1. In addition, the first transistor 11 has its drain (or source) connected to a first bit line $BL_1$, and the second transistor 12 has its drain (or source) connected to a second bit line $BL_2$. Furthermore, the first transistor 11 has its gate connected to a first word line $WL_1$, and the second transistor 12 has its gate connected to a second word line $WL_2$. Numeral 14 denotes the region of the memory cell. Therefore, the memory cell 14 according to the present embodiment is symmetrically structured. The drain (or source) of the first transistor 11 connected to the first bit line $BL_1$ is referred to as a port 1, and the drain (or source) of the second transistor 12 connected to the second bit line $BL_2$ is referred to as a port 2.

Description is now made on an operation of the memory cell. At the time of a write operation, when the first word line $WL_1$, for example, is forced to be a positive potential, the first transistor 11 is turned on, so that information "1" or "0" on the first bit line $BL_1$ is stored in the storage capacitance 13. In addition, at the time of a read operation, when the second word line $WL_2$, for example, is forced to be the positive potential, the second transistor 12 is turned on. When the information "1" is stored in the storage capacitance, a potential on the second bit line $BL_2$ which is precharged in advance rises. On the other hand, when the information "0" is stored in the storage capacitance 13, a potential on the second bit line $BL_2$ lowers. The read operation is performed by detecting the change in potential on the second bit line $BL_2$ by the following method.

In the above described manner, data is written from the port 1 and read out from the port 2. On the other hand, in the same manner, data can be read out from the port 1 and written from the port 2.

Description is now made on an FIFO memory using the memory cell shown in FIG. 3. The FIFO memory sends data so far stored in a first-in first-out order in response to the output demand while storing received data in order. The FIFO memory can be employed mainly as a buffer function for exchanging data between systems having different processing speeds.

Figure 4:
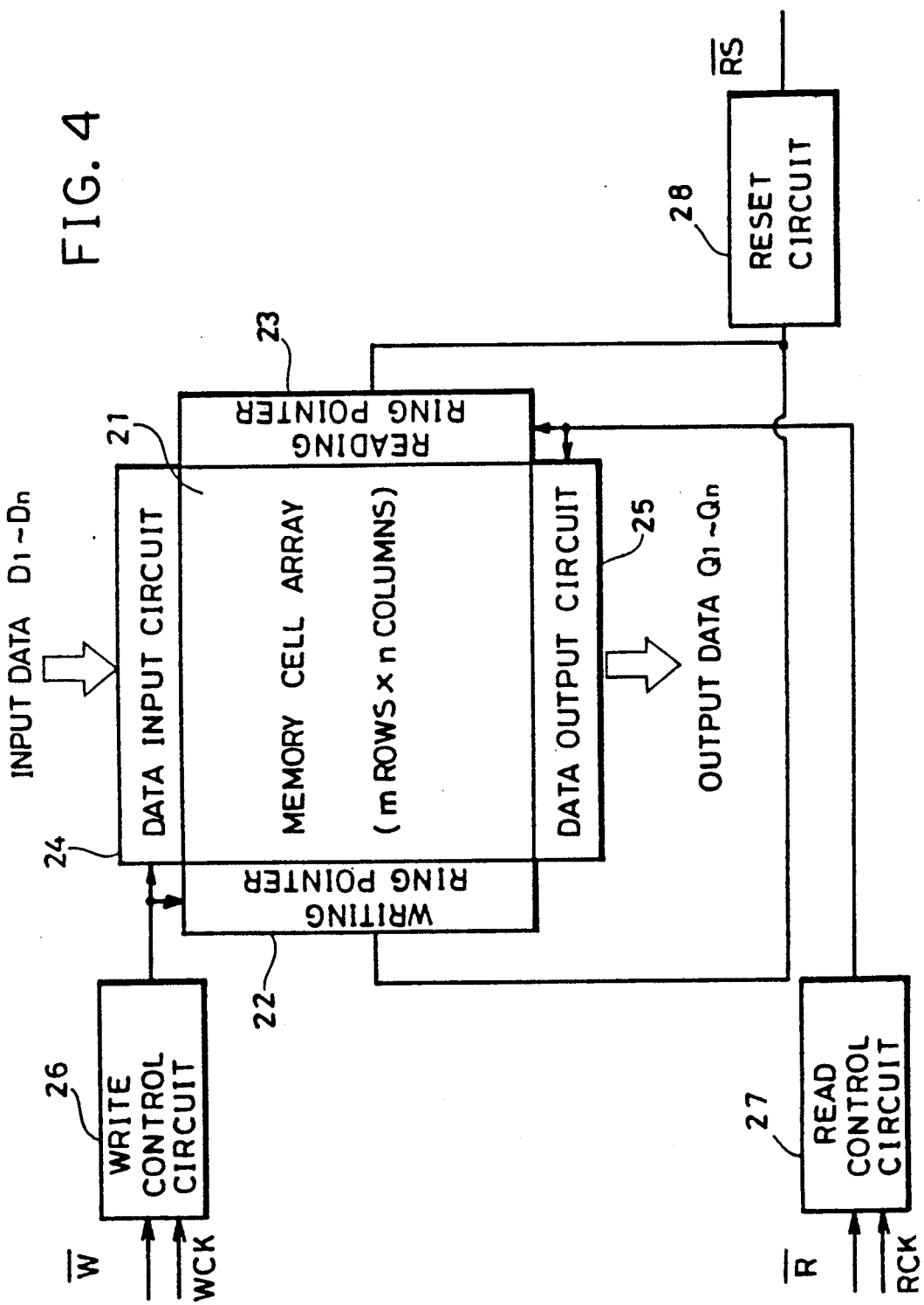
FIG. 4 is a block diagram showing structure of an FIFO memory comprising memory cells shown in FIG. 3.

FIG. 4 is a block diagram showing an FIFO memory comprising m words x n bits. In FIG. 4, a memory cell array 21 has a plurality of memory cells as shown in FIG. 3 arranged in a plurality of rows and columns. A writing ring pointer 22 comprises m-stage shift register and designates a memory cell to which data is to be written, from in the memory cell array 21. A reading ring pointer 23 also comprises m-stage shift register and designates a memory cell from which data is to be read out, from in the memory cell array 21. Output lines of the writing ring pointer 22 are connected to memory cells in the memory cell array 21 as write word lines. Output lines of the reading ring pointer 23 are connected to memory cells in the memory cell array 21 as read word lines.

Furthermore, a data input circuit 24 is used for writing data $D_1$ to $D_n$ to a plurality of memory cells designated by the writing ring pointer 22. A data output circuit 25 is used for reading out data $Q_1$ to $Q_n$ from a plurality of memory cells designated by the reading ring pointer 23. Writing and reading of data to and from the memory cells are independently controlled by a write control circuit 26 and a read control circuit 27, respectively. A reset circuit 28 is used for resetting the writing ring pointer 22 and the reading ring pointer 23.

There may be provided a control circuit for preventing overflow of write data as required.

Figure 5:
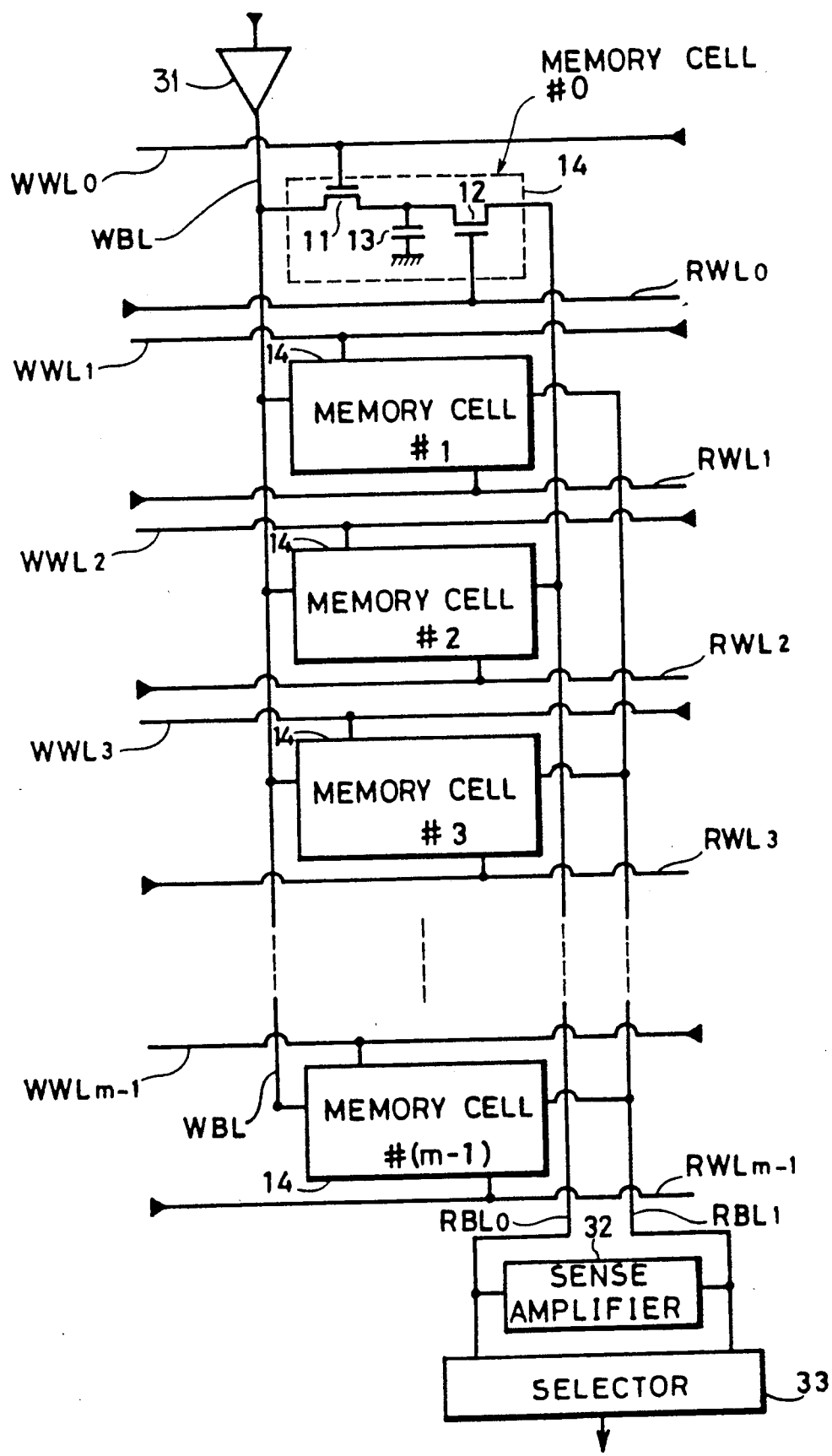
FIG. 5 is a circuit diagram showing structure of one column in a memory cell array included in the FIFO memory shown in FIG. 4.

FIG. 5 is a circuit diagram showing one column in the memory cell array 21 in detail. In FIG. 5, one column in the memory cell array 21 comprises m memory cells #0 to #(m −1). The memory cells #0 to #(m −1) are equivalent to the memory cell shown in FIG. 3. Let's consider the k-th memory cell #k (k =0, 1,... m−1). The first transistor 11 has its gate connected to a write word line $WWL_k$, and the second transistor 12 has its gate connected to a read word line $RWL_k$. The first transistors 11 in all of the memory cells #0 to #(m −1) have their drains connected to a common write bit line WBL.

Furthermore, the second transistors 12 in the k-th memory cell #k (k: even number) have their drains connected to a read bit line RBL0. The second transistors 12 in the k-th memory cell #k (k: odd number) have their drains connected to a read bit line RBL1.

Additionally, the write bit line WBL is driven by a write data driver 31. A sense amplifier 32 and a selector 33 are connected to the read bit lines RBL0 and RBL1. The sense amplifier 32 differentially amplifies the potential difference between the read bit lines RBL0 and RBL1. The selector 33 outputs data on the read bit line RBL0 when information in the k-th memory cell #k (k: even number) is read out while outputting data on the read bit line RBL1 when the k-th memory cell #k (k: odd number) is read out. The write data driver 31 is included in the data input circuit 24 shown in FIG. 4 and the sense amplifier 32 and the selector 33 are included in the data output circuit 25 shown in FIG. 4.

Figure 6:
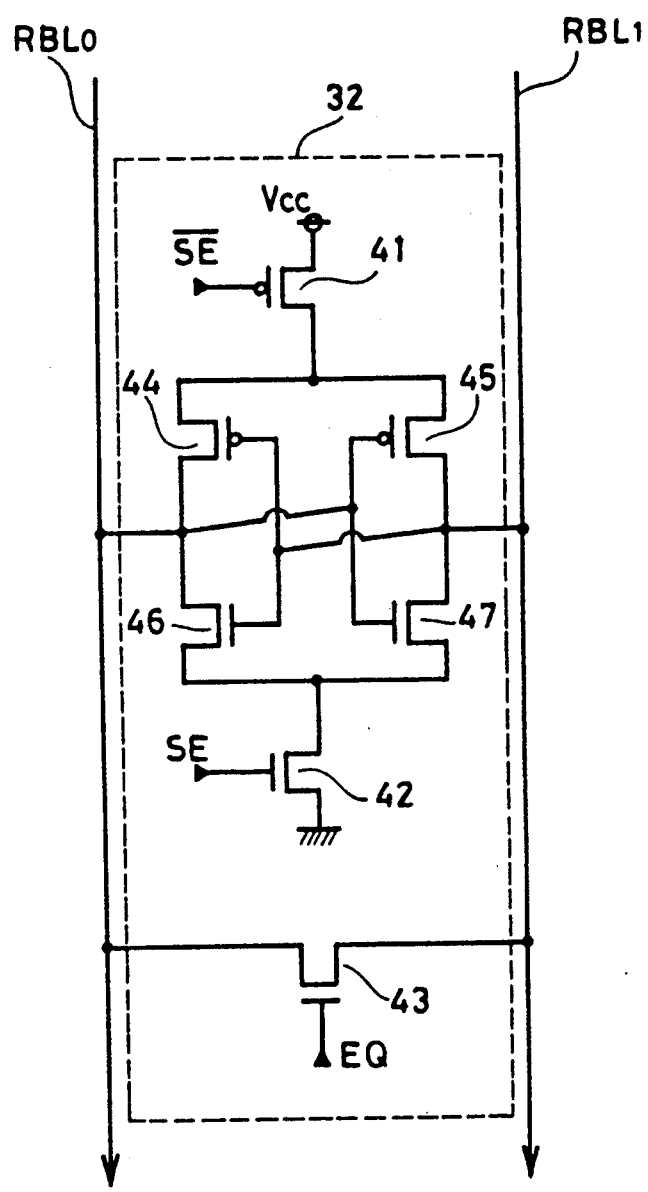
FIG. 6 is a circuit diagram showing an example of a sense amplifier included in the FIFO memory shown in FIG. 4.

FIG. 6 is a circuit diagram showing an example of the sense amplifier 32.

The sense amplifier 32 comprises p channel MOSFETs 41, 44 and 45 and n channel MOSFETs 42, 43, 46 and 47. The transistors 44 and 46 have their drains connected to a read bit line RBL0, and the transistors 45 and 47 have their drains connected to a read bit line RBL1. The transistors 44 and 46 have their gates connected together to the read bit line RBL1, and the transistors 45 and 47 have their gates connected to the read bit line RBL0. The transistors 44 and 45 have their sources coupled to a power-supply potential $V_{CC}$ through the transistor 41, and the transistors 46 and 47 have their sources coupled to a ground potential through the transistor 42. The transistor 42 has its gate receiving a sense enable signal SE, and the transistor 41 has its gate receiving an inverted signal $\overline{SE}$ of the sense enable signal. The transistors 44 to 47 constitute a cross-coupled latch. On the other hand, the transistor 43 is connected between the read bit lines RBL0 and RBL1. The transistor 43 has its gate receiving an equalize signal EQ.

Referring now to FIGS. 3, 4, 5 and 6, description is made on an operation of the FIFO memory according to the present embodiment.

Before a power supply is turned on or a write operation is performed, a reset pulse $\overline{RS}$ is inputted to the reset circuit 28, so that the writing ring pointer 22 and the reading ring pointer 23 are reset at address 0 (see FIG. 4). Then, the write operation of the input data $D_1$ to $D_n$ is started in response to the falling edge of the write signal $\overline{W}$. An address in the writing ring pointer 22 is advanced and the write word lines $WWL_0$ to $WWL_{m-1}$ are selected in order, so that the input data is sequentially stored in the memory cells #0 to #(m −1) through the write bit line WBL (see FIG. 5).

On the other hand, a read operation of data stored in the memory cell 14 is started in response to the falling edge of a read signal $\overline{R}$ (see FIG. 4). An address in the read ring pointer 23 is advanced and the read word lines $RWL_0$ to $RWL_{m-1}$ are selected in order, so that data in the memory cells #1 to #(m −1) are sequentially outputted through the read data bit line RBL0 or RBL1 (see FIG. 5). The write operation and the read operation are independently performed in response to a write clock WCK and a read clock RCK, respectively.

Referring now to a timing chart of FIG. 7, description is made on the read operation in detail. Let's consider a cycle for accessing the k-th memory cell #k (k =0 to m −1). At the beginning of the read cycle, the equalize signal EQ attains the "H" level, so that the transistor 43 (in FIG. 6) is rendered conductive. Therefore, the read bit lines RBL0 and RBL1 are short-circuited, so that potentials on the read bit lines RBL0 and RBL1 are equalized. On this occasion, the potentials on the read bit lines RBL0 and BRL1 are set to $V_{CC}/2$, for the following reason. Thereafter, the equalize signal EQ falls, so that the transistor 43 is turned off. A potential on the read word line $RWL_k$ rises, so that the second transistor 12 in the memory cell #k is turned on. Consequently, the memory cell #k is accessed.

It is assumed that the k-th memory cell k (k =0, 2, 4,...) is accessed. In FIG. 5, when the storage capacitance 13 is discharged to a ground potential (in the case I), the potential on the read word line $RWL_k$ rises and then, the potential on the read bit line RBL0 lowers, by several 100mV, from $V_{CC}/2$ due to distribution of charges between the storage capacitance 13 and the read bit line RBL0. On the other hand, the read bit line RBL1 which is not connected to the memory cell #k remains at the potential $V_{CC}/2$. Thereafter, when the sense enable signal SE rises so that the sense amplifier 32 is activated, the potential difference of several 100mV between the read bit lines RBL0 and RBL1 is amplified by the sense amplifier 32, so that the potential on the read bit line RBL0 falls to 0V and the potential on the read bit line RBL 1 rises to a $V_{CC}$ level (see FIGS. 6 and 7). On the other hand, in FIG. 5, if the storage capacitance 13 is charged to a positive potential (in the case II), the potential on the read word line $RWL_k$ rises and then, the potential on the read bit line RBL0 rises, by several 100mV, from $V_{CC}/2$ due to distribution of charges between the storage capacitance 13 and the read bit line RBL0. On the other hand, the read bit line RBL1 which is not connected to the memory cell #k remains at the potential $V_{CC}/2$. When the sense enable signal SE rises so that the sense amplifier 32 is activated, the potential on the read bit line RBL0 rises to the $V_{CC}$ level and the potential on the read bit line RBL1 lowers to 0V.

In both cases I and II, differential data of the read bit lines RBL0 and RBL1 are latched in the data output circuit 25 (see FIG. 4).

Thereafter, the potential on the read word line $RWL_k$ falls and then, the sense enable signal SE falls. In addition, the equalize signal EQ attains the "H" level so that the transistor 43 is rendered conductive again (see FIG. 6). As a result of distribution of charges between the read bit lines RBL0 and RBL1, the potentials thereon becomes (5 +0)/2 =2.5 [V], so that the read bit lines RBL0 and RBL1 are precharged to 2.5V. Consequently, a read cycle of the memory cell #k is completed.

The operation to occur when the k-th memory cell #k (k =1, 3, 5,...) is accessed can be understood by interchanging descriptions of read bit lines RBL0 and RBL1 in the above described operation.

Additionally, in a folded read bit line structure as shown in FIG. 5, outputs of the sense amplifier 32 are opposite to each other even if the same information is stored in the k-th memory cell (k: even number) and the k-th memory cell (k: odd number). The selector 33 selects and outputs data on the read bit line RBL0 when data is read out from the k-th memory cell (k: even number) while selecting and outputting data on the read bit line RBL1 when data is read out from the k-th memory cell (k: odd number).

In the FIFO memory, the write operation and the read operation are independently performed as described above, so that cycle times thereof may be different from each other.

Figure 8:
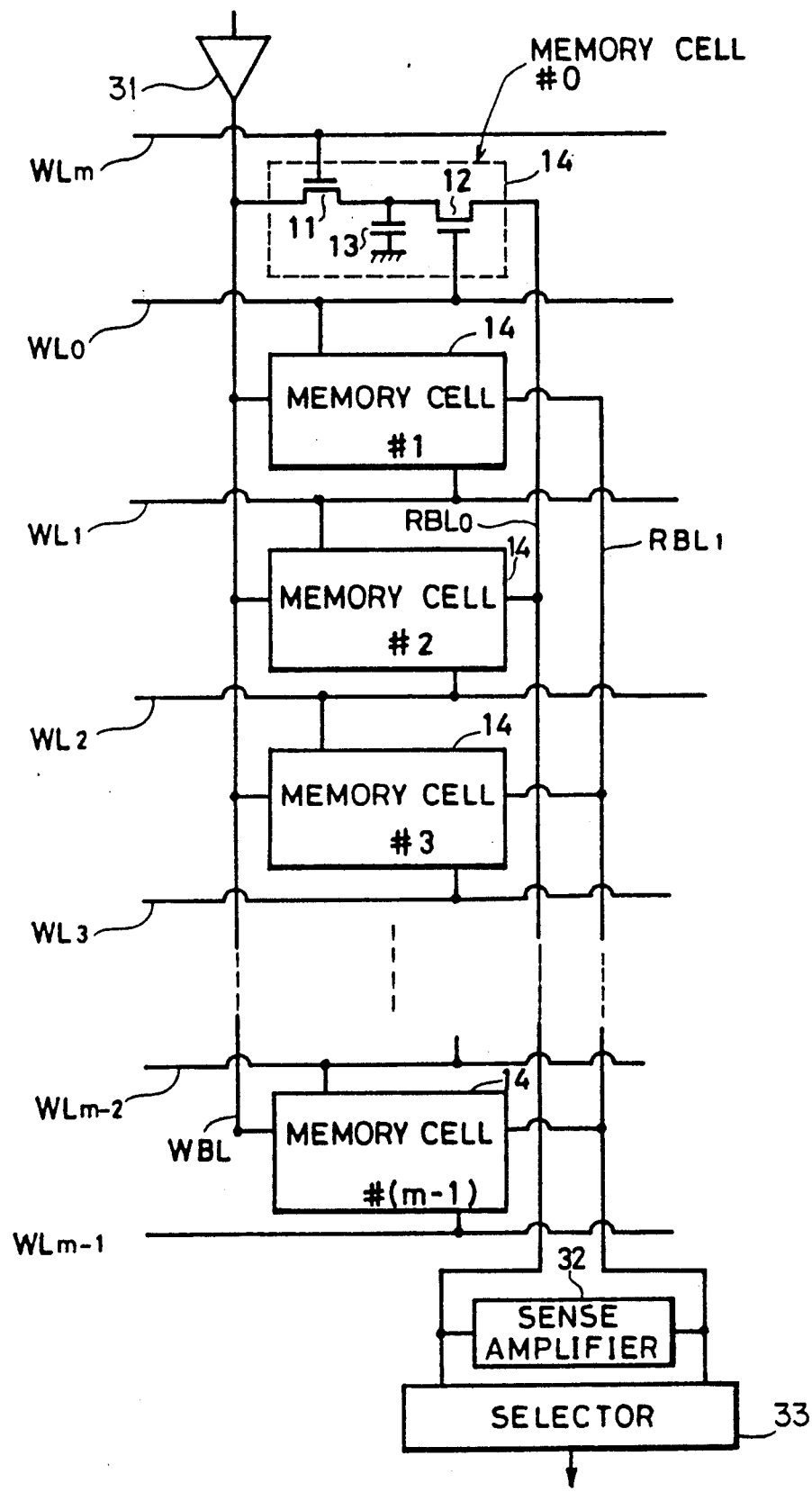
FIG. 8 is a circuit diagram showing structure of one column in a memory cell array included in a semiconductor memory device according to another embodiment of the present invention.

As shown in FIG. 8, when the read word line $RWL_k$ in the k-th memory cell #k and the write word line $WWL_{k+1}$ in the (k +1)-th memory cell are made to be a common word line $WL_k$, a memory device having a shift register function is achieved. More specifically, data is read out from the k-th memory cell #k and at the same time, data is written to the (k +1)-th memory cell #(k +1).

Figure 9:
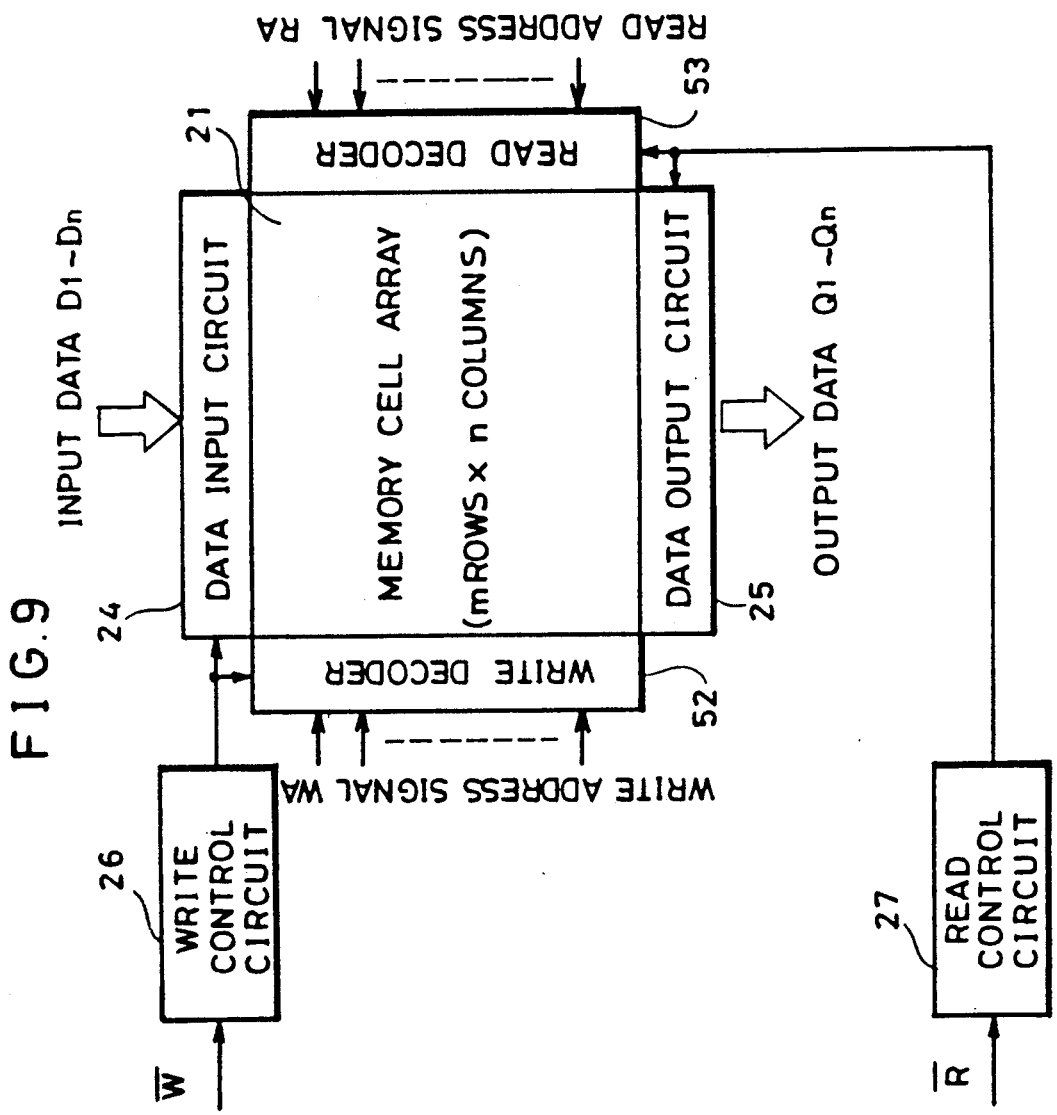
FIG. 9 is a block diagram showing structure of a semiconductor memory device which is accessible at random according to still another embodiment, comprising the memory cells FIG. 3.

Additionally, in the above described embodiment, the writing ring pointer 22 and the reading ring pointer 23 are employed as word line selecting means, so that an FIFO memory is structured in which the read operation and the write operation are sequentially performed. However, as shown in FIG. 9, the writing ring pointer 22 and the reading ring pointer 23 may be replaced with a write decoder 52 and a read decoder 53, so that a memory which is accessible at random is structured. In this case, the write decoder 52 and the read decoder 53 select memory cells in the memory cell array 21 in response to the write address signal WA and the read address signal RA.

Although in the above described embodiment, a sense amplifier of a latch type is employed, it is not intended to the same. A sense amplifier having another structure may be employed.

Figure 2:
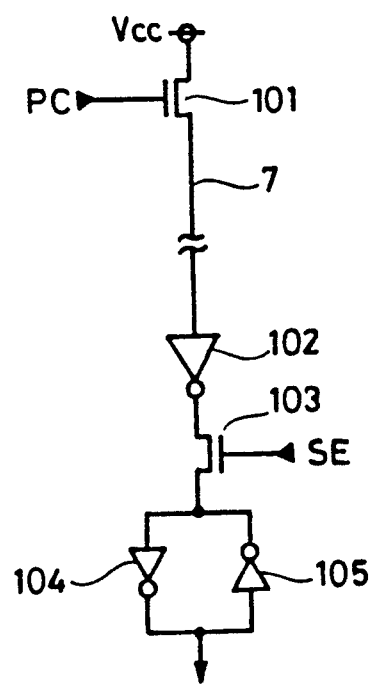
FIG. 2 is a diagram showing a precharging circuit and a sense amplifier circuit of a read bit line in the semiconductor memory device shown in FIG. 1.

Although in the above described embodiment, read bit lines have a folded bit line structure, it is not intended to the same. All memory cells in one column may be connected to a single read bit line. In such a case, the structure of the sense amplifier, the precharging circuit and the like may be replaced with, for example, circuit structure shown in FIG. 2. In addition, although in the above described embodiment, two read bit lines are precharged to the $V_{CC}/2$ level by distributing charges between the bit lines, the read bit lines may be set to the $V_{CC}/2$ level by a bias circuit.

Additionally, in the dynamic memory cells according to the above described embodiment, since the data holding time is limited, data stored in the memory cells may be refreshed by sequentially selecting the read word line as required to perform the read operation.

Figure 10:
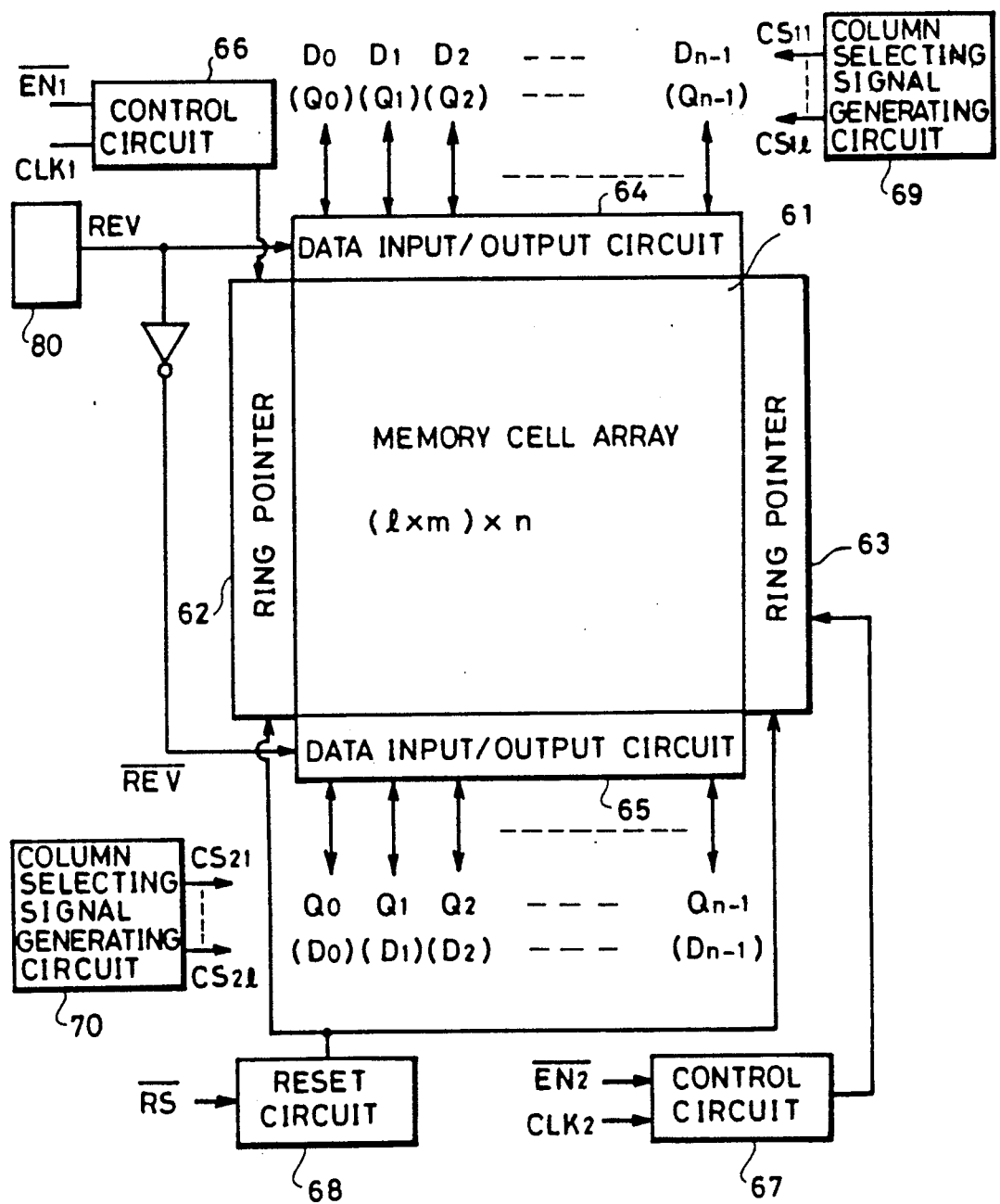
FIG. 10 is a block diagram showing structure of an FIFO memory according to yet another embodiment, comprising the memory cells shown in FIG. 3.

FIG. 10 is a block diagram showing an FIFO memory comprised of m rows x 1 columns x n bits according to another embodiment. In FIG. 10, a memory cell array 61 has a plurality of memory cells as shown in FIG. 3 arranged in a plurality of rows and columns. The memory cell array 61 is divided into n blocks, each of the blocks comprising memory cells in 1 columns. A first ring pointer 62 comprises m-stage shift register and designates a memory cell from or to which data is to be read out or written through a port 1, from in the memory cell array 61. A second ring pointer 63 also comprises m-stage shift register and designates a memory cell to or from which data is to be written or read out through a port 2, from in the memory cell array 61. Output lines of the first ring pointer 62 are connected to memory cells in the memory cell array 61 as first word lines, and output lines of the second ring pointer 63 are connected to memory cells in the memory cell array 61 as second word lines.

Furthermore, a first data input/output circuit 64 is used for writing or reading out data $D_0$ to $D_{n-1}$ through the port 1 to a plurality of memory cells designated by the first ring pointer 62. A second data input/output circuit 65 is used for reading out or writing data $Q_0$ to $Q_{n-1}$ through the port 2 from a plurality of memory cells designated by the second ring pointer 63. Writing or reading of data through the port 1 to or from the memory cells and reading or writing of data through the port 2 from or to the memory cells are independently controlled by a first control circuit 66 and a second control circuit 67, respectively. A reset circuit 68 is used for resetting the first ring pointer 62 and the second ring pointer 63.

A first column selecting signal generating circuit 69 selects one column of memory cells for writing or reading through the port 1 in each block in the memory cell array 61. A second column selecting signal generating circuit 70 selects one column of memory cells for reading out or writing data through the port 2 in each block in the memory cell array 61. A switching signal generating circuit 80 generates a switching signal REV for switching input/output states of the first data input/output circuit 64 and the second data input/output circuit 65.

Figure 11:
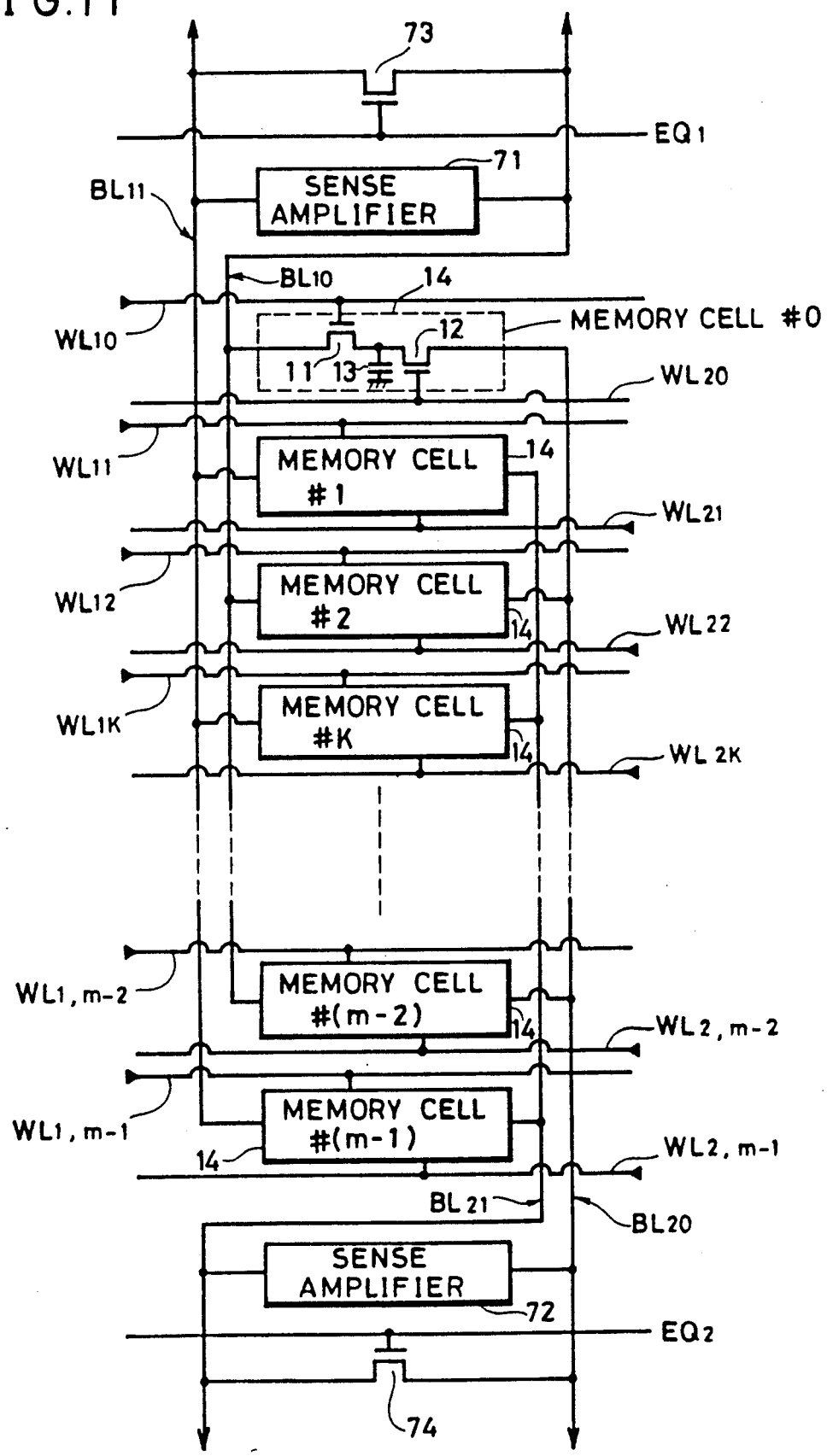
FIG. 11 is a circuit diagram showing structure of one column in a memory cell array included in the FIFO memory shown in FIG. 10.

FIG. 11 is a circuit diagram showing one column in the memory cell array 61 in detail. In FIG. 11, one column in the memory cell array 61 comprises m memory cells #0 to #(m −1). Each of the memory cells #0 to #(m −1) is equivalent to the memory cell shown in FIG. 3. Let's consider the k-th memory cell #k (k =0, 1,..., m −1). The first transistor 11 has its gate connected to a first word line $WL_{1k}$, and the second transistor 12 has its gate connected to a second word line $WL_{2k}$. Two first bit lines and two second bit lines are provided in each column. The first transistor 11 in the k-th memory cell #k (k: even number) has its drain (port 1) connected to a first bit line $BL_{10}$, and the first transistor 12 in the k-th memory cell #k (k: odd number) has its drain (port 1) connected to a first bit line $BL_{11}$. The second transistor 12 in the k-th memory cell #k (k: even number) has its drain (port 2) connected to a second bit line $BL_{20}$, and the second transistor 12 in the k-th memory cell #k (k: odd number) has it drain (port 2) connected to a second bit line $BL_{21}$.

A first sense amplifier 71 and an n channel MOSFET 73 are connected between the first bit lines $BL_{10}$ and $BL_{11}$. A second sense amplifier 72 and an n channel MOSFET 74 are connected between the second bit lines $BL_{20}$ and $BL_{21}$. The first sense amplifier 71 differentially amplifies the potential difference between the first bit lines $BL_{10}$ and $BL_{11}$ at the time of reading out data or refresh operation. The second sense amplifier 72 differentially amplifies the potential difference between the second bit lines $BL_{20}$ and $BL_{21}$ at the time of reading out data or refresh operation. The n channel MOSFET 73 equalizes potentials on the first bit lines $BL_{11}$ and $BL_{10}$. The n channel MOSFET 74 equalizes potentials on the second bit lines $BL_{20}$ and $BL_{21}$. In the read or write cycle, the potentials on the first bit lines $BL_{10}$ and $BL_{11}$ and the potentials on the second bit lines $BL_{20}$ and $BL_{21}$ are equalized by the above described MOSFETs 73 and 74, respectively, before the first word line $WL_{1k}$ or the second word line $WL_{2k}$ are charged, to prepare for a sense operation by the first and second sense amplifiers 71 and 72.

As described above, the memory cell array 61 according to the present embodiment has a folded bit line structure and the port 1 and the port 2 of each memory cell 14 are symmetrically structured.

Figure 12A:
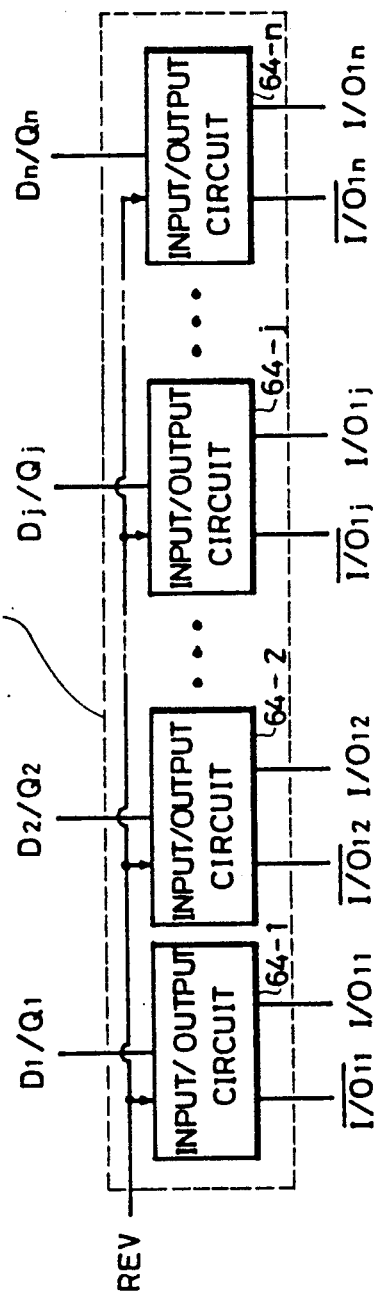
FIG. 12A is a block diagram showing structure of a first data input/output circuit included in the FIFO memory shown in FIG. 10.

FIG. 12A is a block diagram showing structure of the first data input/output circuit 64 shown in FIG. 10.

The first data input/output circuit 64 comprises n input/output circuits 64-1 to 64-n corresponding to n blocks in the memory cell array 61. Each of the input/output circuits 64-j has an external terminal $D_j/Q_j$, an I/O terminal $I/O_{1j}$ and an I/O terminal $I/O_{1j}$ where j is an integer from 1 through n. In addition, a switching signal REV is applied to all of the input/output circuits 64-1 to 64-n included in the first data input/output circuit 64. Each of the input/output circuits 64-j writes and reads out data through the port 1 to and from each of memory cells in m rows x 1 columns included in a corresponding block.

Figure 12B:
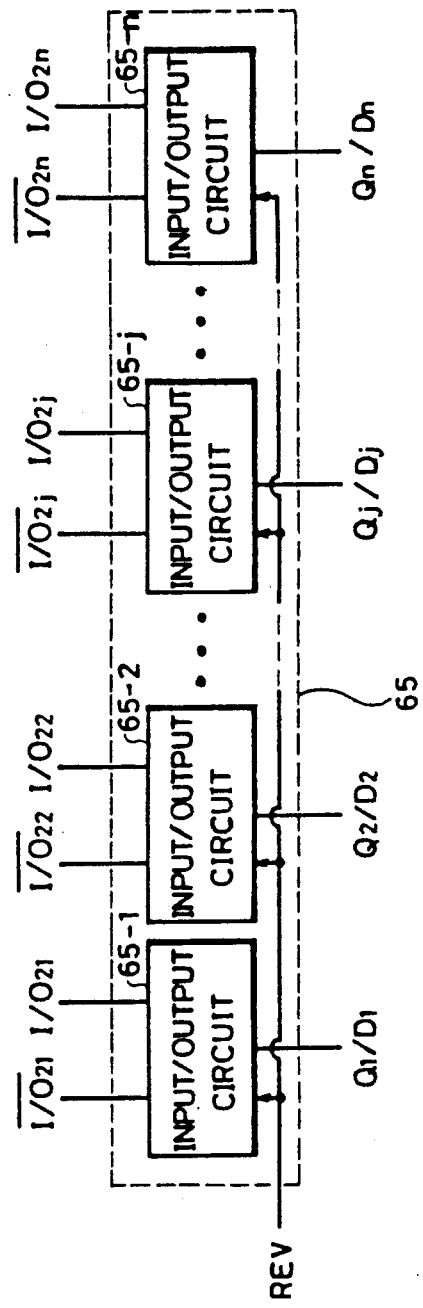
FIG. 12B is a block diagram showing structure of a second data input/output circuit included in the FIFO memory shown in FIG. 10.

FIG. 12B is a block diagram showing structure of the second data input/output circuit 65 shown in FIG. 10.

The second data input/output circuit 65 comprises n input/output circuits 65-1 to 65-n, similarly to the first data input/output circuit 64. Each of the input/output circuits 65-j has an external terminal $Q_j/D_j$, an I/O terminal $I/O_{2j}$ and an I/O terminal $I/O_{2j}$. In addition, an inverted switching signal $\overline{REV}$ obtained by inverting the switching signal REV is applied to all of the input/output circuits 65-1 to 65-n included in the second data input/output circuit 65. Each of the input/output circuits 65-j writes and reads out data through the port 2 to and from each of memory cells in m rows x 1 columns included in a corresponding block.

Figure 13A:
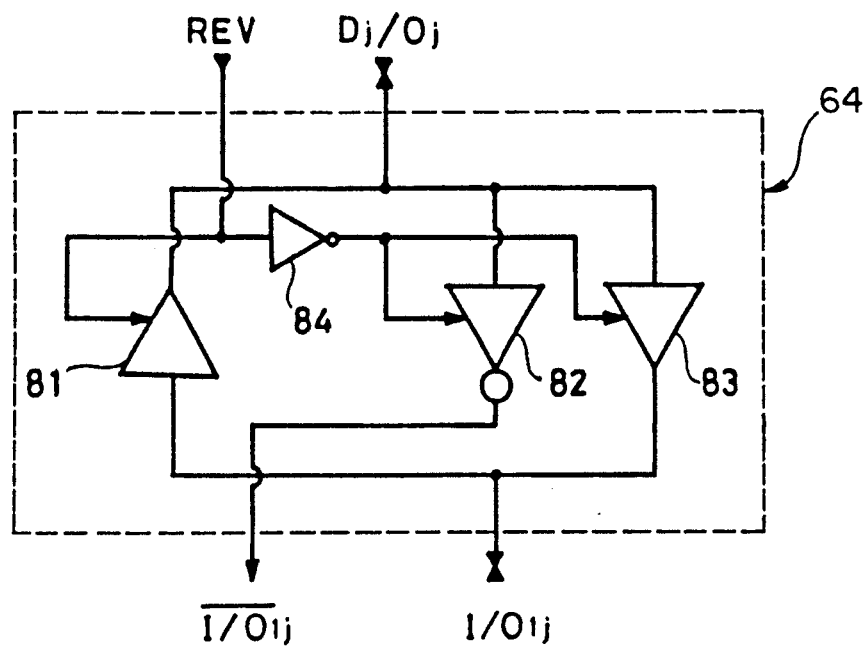
FIG. 13A is a circuit diagram showing structure of the input/output circuit shown in FIG. 12A.

FIG. 13A is a circuit diagram showing the input/output circuit 64-j shown in FIG. 12A. The input/output circuit 64-j comprises a non-inverted tri-state buffer 81 for reading out data, an inverted tri-state buffer 82 for writing data, a non-inverted tri-state buffer 83 for writing data and an inverter 84. A switching signal REV is applied to the tri-state buffer 81, and a signal obtained by inverting the switching signal REV by the inverted 84 is applied to the tri-state buffers 82 and 83. When the switching signal REV is at the "H" level, the tri-state buffer 81 is rendered conductive, so that data applied to the I/O terminal I/O$_{1j}$ is outputted to the external terminal D$_j$/Q$_j$. On this occasion, the tri-state buffers 82 and 83 are rendered non-conductive. On the other hand, when the switching signal REV is at the "L" level, the tri-state buffers 82 and 83 are rendered conductive, so that the data applied to the external terminal D$_j$/Q$_j$ is outputted to the I/O terminal I/O$_{1j}$ and inverted data of the data is outputted to the I/O terminal $\overline{I/O_{1j}}$. Thus, the input/output circuit 64-j enters a read state when the switching signal REV is at the "H" level while entering a write state when the switching signal REV is at the "L" level.

Figure 13B:
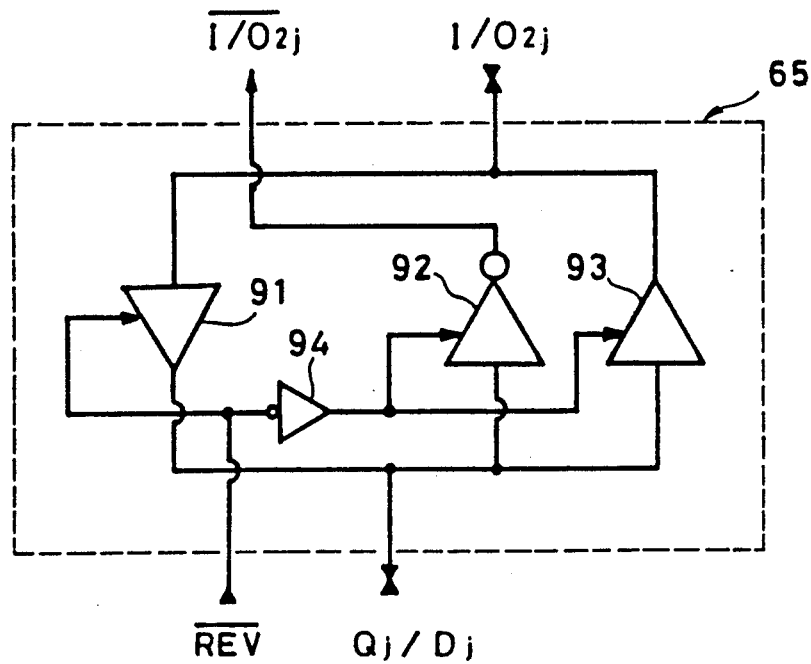
FIG. 13B is a circuit diagram showing structure of the input/out shown in FIG. 12B.

FIG. 13B is a circuit diagram showing the input/output circuit 65-j shown in FIG. 12B.

The input/output circuit 65-j comprises a non-inverted tri-state buffer 91 for reading out data, an inverted tri-state buffer 92 for writing data, a non-inverted tri-state buffer 93 for writing data and an inverter 94, similarly to the input/output circuit 64-j. An inverted switching signal REV obtained by inverting the switching signal REV is applied to the tri-state buffer 91, a signal obtained by inverting the inverted switching signal REV by the inverter 94 is applied to the tri-state buffers 92 and 93. When the inverted switching signal REV is at the "H" level, the tri-state buffer 91 is rendered conductive, so that data applied to the I/O terminal I/O$_{2j}$ is outputted to the external terminal Q$_j$/D$_j$. On this occasion, the tri-state buffers 92 and 93 are rendered non-conductive. On the other hand, when the inverted switching signal REV is at the "L" level, the tri-state buffers 92 and 93 are rendered conductive, so that data applied to the external terminal Q$_j$/D$_j$ is outputted to the I/O terminal I/O$_{2j}$ and inverted data of the data is outputted to the I/O terminal I/O$_{2j}$. Thus, the input/output circuit 65-j enters a read state when the inverted switching signal REV is at the "H" level while entering a write state when the inverted switching signal REV is at the "L" level.

FIG. 14 is a diagram showing structure of a single block in the memory cell array 61.

A portion represented by numeral 50 in FIG. 14 corresponds to one column comprising m memory cells as shown in FIG. 11. In FIG. 14, a single block in the memory cell array 21 comprises memory cells in 1 columns. More specifically, in each block, memory cells are arranged in a matrix of m rows and 1 columns. Respective first bit line pairs BL$_{10}$ and BL$_{11}$ in columns 50 are connected together to the I/O terminal I/O$_{1j}$ and the I/O terminal I/O$_{1j}$ in the input/output circuit 64-j through column selecting gates 76 and 75 each formed by the n channel MOSFET, respectively. In addition, respective second bit line pairs BL$_{20}$ and BL$_{21}$ in columns 50 are connected together to the I/O terminal I/O$_{2j}$ and the I/O terminal I/O$_{2j}$ in the input/output circuit 65-j through column selecting gates 78 and 77 each formed by the n channel MOSFET, respectively. The column selecting gates 75 and 76 in each column 50 have their gates receiving a corresponding first column selecting signal CS$_{1i}$ (i=1 to l)

l) by the second column selecting signal generating circuit 70 shown in FIG. 10.

The first column selecting signals CS$_{1i}$ to CS$_{1l}$ attain sponding second column selecting signal CS$_{2i}$ (i =1 to λ) by the second column selecting signal generating circuit 70 shown in FIG. 10.

The first column selecting signals CS$_{1i}$ to CS$_{1λ}$ attain the "H" level in order for every cycle of outputs from the first ring pointer 62 shown in FIG. 10, so that one column out to l columns is selected in order in each block. In the same manner, the second column selecting signals CS$_{21}$ to CS$_{2l}$ attain the "H" level in order for every cycle of outputs from the second ring pointer 23, so that one column out of l columns is selected in order in each block. When the switching signal REV is at the "L"level, the input/output circuit 64-j enters a write state, so that data applied to the external terminal D$_j$/D$_j$ are transmitted to the I/O terminal I/O$_{1j}$ and the I/O terminal I/O$_{1j}$. The data are written to one of the memory cells included in the column 50 selected by the first column selecting signal CS$_{1i}$ through the port 1 from the first bit line BL$_{10}$ or BL$_{11}$.

On the other hand, on this occasion, the inverted switching signal REV attains the "H" level, so that the input/output circuit 65-j enters a read state. Data is read out to the second bit lines BL$_{20}$ and BL$_{21}$ through the port 2 from one of the memory cells included in the column 50 selected by the second column selecting signal CS$_{2i}$. The data are transmitted to the external terminal Q$_j$/D$_j$ from the I/O terminal I/O$_{2j}$ and the I/O terminal I/O$_{2j}$ of the input/output circuit 65-j.

On the other hand, when the switching signal REV is a the "H" level, the input/output circuit 64-j enters a read state and the input/output circuit 65-j enters a write state.

Description is now made on an operation of the FIFO memory according to the present embodiment.

The switching signal REV is set in advance to the "H" level or the "L" level, so that it is determined whether or not the ports 1 or 2 enter a write mode or a read mode (see FIG. 10). When the switching signal REV is at the "L" level, the port 1 in each memory cell 14 becomes a write port and the port 2 therein becomes a read port. A reset pulse RS is inputted to the reset circuit 68 before the write operation, so that the first ring pointer 62 and the second ring pointer 63 are reset at address 0.

Then, when a first enable signal EN1 applied to the first control circuit 66 falls, the input data D$_0$ to D$_{n-1}$ start to be written in synchronization with a clock CLK1. An address in the first ring pointer 62 is advanced and the first word lines WL$_{10}$ to WL$_{1, m-1}$ are selected in order, so that the input data D$_0$ to D$_{n-1}$ are sequentially stored in the memory cells #0 to #(m −1) through the first bit line BL$_{10}$ or BL$_{11}$ in a corresponding block, respectively (see FIG. 11). More specifically, in each memory cell 14, the first word line WL$_{1k}$ k =0 to m −1) becomes a positive potential, so that the first transistor 11 is turned on. Consequently, information "1 " or "0 " on the first bit line BL$_{10}$ or BL$_{11}$ is stored in the storage capacitance 13.

On the other hand, when a second enable signal EN2 applied to the second control circuit 67 falls, data stored in the memory cell 14 starts to be read out in synchronization with a clock CLK2 (see FIG. 10). An address in the second ring pointer 63 is advanced and the second word lines $WL_{20}$ to $WL_{2, m-1}$ are selected in order, so that data in the memory cells #1 to #(m −1) are sequentially outputted to the second bit line $BL_{20}$ or $BL_{21}$ (see FIG. 11). More specifically, in each memory cell 14, the second word line $WL_{2k}$ (k =0 to m −1) becomes a positive potential, so that the second transistor 12 is turned on. On this occasion, when the storage capacitance 13 is charged to the positive potential, the potential on the second bit line $BL_{20}$ or $BL_{21}$ which is precharged in advance rises. When the storage capacitance 13 is discharged to a ground potential, the potential on the second bit line $BL_{20}$ or $BL_{21}$ lowers.

Data read out to the second bit line BL or BL21 are differentially amplified by the second sense amplifier 72 and then, sequentially outputted as the output data $Q_0$ to $Q_{n-1}$ through the column selecting gates 77 and 78 and the input/output circuit 65/j (see FIG. 14).

The above described write operation and read operation are independently performed, so that an FIFO operation is achieved in which the write operation and the read operation are asynchronously performed.

Then, when the switching signal REV attains "H"level, the port 2 in each memory cell 14 becomes a write port and the port 1 therein becomes a read port. Since circuit structure is completely symmetrical, the direction for inputting/outputting data in this case is opposite to that in the above described case. Consequently, the same operation as the above described operation is performed, so that an FIFO operation is achieved in which the write operation and the read operation are asynchronously performed.

In the above described embodiment, a control circuit for preventing overflow of write data may be provided as required.

Furthermore, in the above described embodiment, since a dynamic memory cell is employed so that the data holding time is limited, a refresh control circuit may be added as required.

In addition, the layout of a memory cell is made symmetrical, so that the memory cell can have the same performance in both directions.

Additionally, as a process technique, a two-layer polysilicon (polycrystalline silicon) gate process of dynamic RAM standards may be employed. In consideration of the application of a core cell such as an ASIC (Application Specific Integrated Circuit), a single-layer polysilicon gate process may be employed.

Figure 15A:
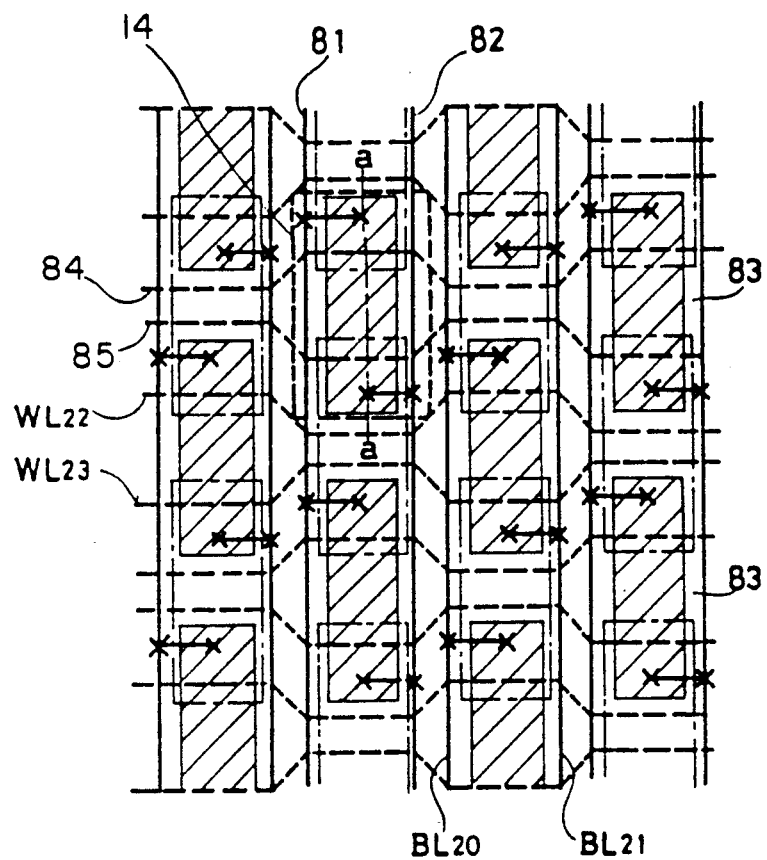
FIG. 15A is a plan view showing a layout pattern of memory cells according to the present invention.
Figure 15B:
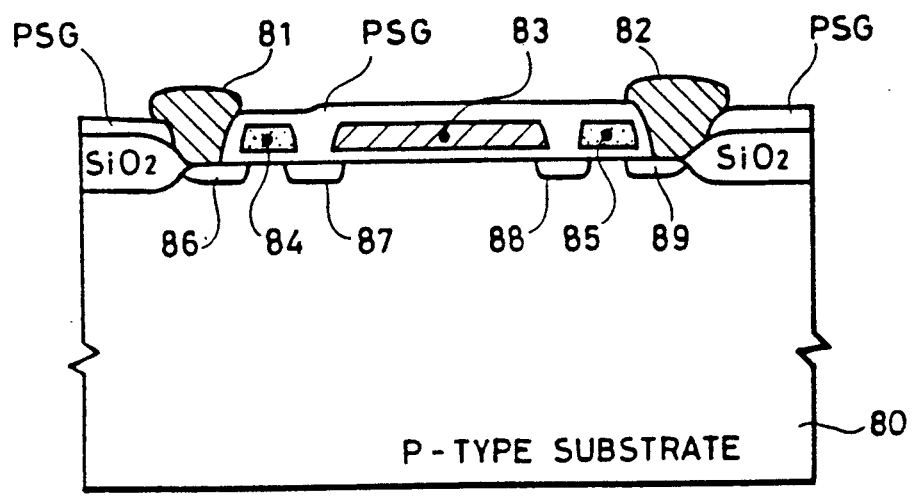
FIG. 15B is a sectional view taken along a line a—a of FIG. 15A illustrating a memory cell.

FIG. 15A is a plan view showing a layout pattern of memory cells according to the present invention, and FIG. 15B is a sectional view taken along a line a-a of FIG. 15A illustrating a memory cell.

Reference numerals of bit lines and word lines in FIG. 15A correspond to reference numerals of bit lines and word lines in FIG. 11.

In FIGS. 15A and 15B, aluminum layers 81 and 82 correspond to bit lines $BL_{10}$ and $BL_{11}$ shown in FIG. 11, respectively. A cell plate is formed by a first polysilicon layer 83. The capacitance 13 (FIGS. 3, 5 and 11) is formed between the cell plate 83 and a P-type substrate 80. Second polysilicon layers 84 and 85 correspond to word lines $WL_{20}$ and $WL_{21}$ shown in FIG. 11, respectively. N+diffusion layers 86 and 87 constitute the transistor 11 (FIGS. 3, 5 and 11) together with the second polysilicon layer 84. The N+diffusion layer 86 is connected to the aluminum layer 81 (the bit line $BL_{10}$).

In addition, N+diffusion layers 88 and 89 constitute the transistor 12 (FIGS. 3, 5 and 11) together with the second polysilicon layer 85. The N+diffusion layer 89 is connected to the aluminum layer 82 (the bit line $BL_{11}$). Although one example of a planar type memory cell in a folded bit line type memory device is shown in FIGS. 15A and 15B, the memory cell of the present invention can be formed into a trench type memory cell or a memory cell in an open bit line type memory device.

As described in the foregoing, according to the present invention, since each memory cell comprises two transistors and one capacitance means, the following advantages can be obtained.

(1). There is provided a semiconductor memory device having an increased integration density.

(2). There is provided a semiconductor memory device that is symmetrical for transferring information in both directions.

(3). There is provided a semiconductor memory device comprising memory cells that occupy a small amount of surface area of a substrate.

(4). There is provided a semiconductor memory device having increased operating speed.

(5). There is provided a semiconductor memory device that requires a reduced amount of operating current.

(6). There is provided a semiconductor memory device wherein bit line and word line capacitances are reduced to improve operating speed and minimize current consumption.

(7). There is provided a DRAM formed of cells that require a minimum amount of substrate surface area.

(8). There is provided a FIFO memory formed of cells that require a minimum amount of substrate surface area.

(9). There is provided memory cells formed of a reduced number of components and to implement said cells into a DRAM or FIFO memory.

(10). There is provided a semiconductor memory device, wherein writing into and reading from each cell is independent and bidirectional.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
    at least one memory cell for storing an information charge,
    a first bit line connected to said memory cell, and
    a second bit line connected to said memory cell,
    said memory cell comprising
        capacitance means for storing information,
        first transferring means connected between said first bit line and siad capacitance means for directly transferring said information charge between said first bit line and said capacitance means, and
        second transferring means connected between said second bit line and said capacitance means for directly transferring said information charge between said second bit line and said capacitance means.

2. A dynamic semiconductor memory device according to claim 1, which further comprises:

at least one first selecting line connected to said memory cell, at least one second selecting line connected to said memory cell, first selecting means for applying a first selecting signal to said first selecting line, and second selecting means for applying a second selecting signal to said second selecting line, and wherein said first transferring means comprises a first transistor responsive to said first selecting signal applied to said first selecting line for transferring information between said first bit line and said capacitance means, and said second transferring means comprises a second transistor responsive to said second selecting signal applied to said second selecting line for transferring information between said second bit line and said capacitance means.

3. A dynamic semiconductor memory device comprising:

at least one memory cell for storing information, said memory cell including capacitance means for storing information, first transferring means connected between said first bit line and said capacitance means for transferring information between said first bit line and said capacitance means, and second transferring means connected between said second bit line and said capacitance means for transferring information between said second bit line and said capacitance means, a first bit line connected to said memory cell, a second bit line connected to said memory cell, at least one first selecting line connected to said memory cell, at least one second selecting line connected to said memory cell, first selecting means for applying a first selecting signal to said first selecting line, and second selecting means for applying a second selecting signal to said selecting line, and second selecting means for applying a second selecting signal to said second selecting line, wherein said first transferring means comprises a first transistor responsive to said first selecting signal applied to said first selecting line for transferring information between said first bit line and said capacitance means, and said second transferring means comprises a second transistor responsive to said second selecting signal applied to said second selecting line for transferring information between said second bit line and said capacitance means, and wherein said first transistor comprises one conduction terminal connected to said capacitance means and a control terminal connected to said first selecting line, and said second transistor comprises one conduction terminal connected to said second bit line, another conduction terminal connected to said capacitance means and a control terminal connected to said second selecting line.

4. A dynamic semiconductor memory device according to claim 3, wherein said first transistor and said second transistor comprise MOS field effect transistors.

5. A dynamic semiconductor memory device according to claim 2, wherein said first bit line comprises a write bit line, said second bit line comprises a read bit line, said first transistor is responsive to said first selecting signal applied to said first selecting line for transferring information applied through said write bit line to said capacitance means, and said second transistor is responsive to said second selecting signal applied to said second selecting line for transferring information stored in said capacitance means to said read bit line.

6. A dynamic semiconductor memory device according to claim 2, which further comprises first input/output means for inputting and outputting information through said first bit line, and second input/output means for inputting and outputting information through said second bit line.

7. A dynamic semiconductor memory device having a small occupied area, comprising:

a plurality of memory cells arranged in at least one column for storing information, at least one write bit line provided corresponding to each column of said plurality of memory cells, at least one read bit line provided corresponding to each column of said plurality of memory cells, a plurality of first selecting lines each provided corresponding to each of said memory cells in said each column, a plurality of second selecting lines each provided corresponding to each of said memory cells in said each column, first selecting means for applying a write selecting signal to any of said plurality of first selecting lines, and second selecting means for applying a read selecting signal to any of said plurality of second selecting lines, each of said memory cells comprising capacitance means for storing information, a first transistor connected between said write bit line and said capacitance means and responsive to said write selecting signal applied to corresponding one of said first selecting lines for transferring information applied through said write bit line to said capacitance means, and a second transistor connected between said read bit line and said capacitance means and responsive to said read selecting signal applied to corresponding one of said second selecting lines for transferring information stored in said capacitance means to said read bit line.

8. A dynamic semiconductor memory device according to claim 7, wherein said first transistor comprises one conduction terminal connected to said write bit line, another conduction terminal connected to said capacitance means and a control terminal connected to said first selecting lines, and said second transistor comprises one conduction terminal connected to said read bit line, another conduction terminal connected to said capacitance means and a control terminal connected to said second selecting lines.

9. A dynamic semiconductor memory device according to claim 7, wherein said first selecting means and said second selecting means comprise ring pointers for applying in order said write selecting signal and said read selecting signal to corresponding one of said plurality of first selecting lines and said plurality of second selecting lines, respectively.

10. A dynamic semiconductor memory device according to claim 9, which further comprises
information inputting means for applying information to said write bit line,
a sense amplifier connected to said read bit line for amplifying information on the read bit line, and
information outputting means for extracting said information from said sense amplifier.

11. A dynamic semiconductor memory device according to claim 10, wherein
said at least one read bit line comprises two read bit lines for every column of said plurality of memory cells, the k-th memory cell (k: odd number) out of said memory cells in each column being connected to one of said two read bit lines and the k-th memory cell (k: even number) out of said memory cells in each column being connected to the other of said two read bit lines.

12. A dynamic semiconductor memory device according to claim 11, which further comprises
information selecting means for selecting information on one of said two read bit lines when said k-th memory cell (k: odd number) is selected while selecting information on the other of said two read bit lines when said k-th memory cell (k: even number) is selected.

13. A dynamic semiconductor memory device according to claim 7, wherein
said first selecting lines each corresponding to each of said memory cells and said second selecting lines each corresonding to a memory cell adjacent to the memory cell are one and the same, and
said first selecting means and said second selecting means are one and the same.

14. A dynamic semiconductor memory device according to claim 7, wherein
said first selecting means and said second selecting means comprise decoders responsive to an address signal for applying said write selecting signal and said read selecting signal to any of said plurality of first selecting lines and said plurality of second selecting lines, respectively.

15. A dynamic semiconductor memory device according to claim 14, which further comprises
informatin inputting means for applying information to said write bit line,
a sense amplifier connected to said read bit line for amplifying information on the read bit line, and
information outputting means for extracting said information from said sense amplifier.

16. A dynamic semiconductor memory device according to claim 15, wherein
said at least one read bit line comprises two read bit lines for every column of said plurality of memory cells, the k-th memory cell (k: odd number) out of said memory cells in each column being connected to one of said two read bit lines and the k-th memory cell (k: even number) out of said memory cells in each column being connected to the other of said two read bit lines.

17. A dynamic semiconductor memory device having a small occupied area, comprising:
a plurality of memory cells arranged in at least one column for storing information,
at least one first bit line provided corresponding to each column of said plurality of memory cells,
at least one second bit line provided corresponding to each column of said plurality of memory cells,
first inputting/outputting means for inputting and outputting information through said first bit line,
second inputting/outputting means for inputting and outputting information through said second bit line,
a plurality of first selecting lines each provided corresponding to each of said memory cells in said each column,
a plurality of second selecting lines each provided corresponding to each of said memory cells in said each column,
first selecting means for applying a first selecting signal to any of said plurality of first selecting lines, and
second selecting means for applying a second selecting signal to any of said plurality of second selecting lines,
each of said memory cells comprising
capacitance means for storing information,
a first transistor connected between said first bit line and said capacitance means and responsive to said first selecting signal applied to corresponding one of said first selecting lines for transferring information between said first bit line and said capacitance means, and
a second transistor connected between said second bit line and said capacitance means and responsive to said second selecting signal applied to corresponding one of said second selecting lines for transferring information between said second bit line and said capacitance means.

18. A dynamic semiconductor memory device according to claim 17, which further comprises signal generating means for generating a first signal and a second signal, and wherein
said first inputting/outputting means enters an input state in response to said first signal and enters an output state in response to said second signal, and
said second inputting/outputting means enters an input state in response to said second signal and enters an output state in response to said first signal.

19. A dynamic semiconductor memory device according to claim 18, wherein
said first inputting/outputting means comprises
a first input/output terminal,
first write transferring means responsive to said first signal for transferring information applied to said first input/output terminal to said first bit line, and
first read transferring means responsive to said second signal for transferring information on said first bit line to said first input/output terminal,
said second inputting/outputting means comprises
a second input/output terminal,
second write transferring means responsive to said second signal for transferring information applied to said second input/output terminal to said second bit line, and
second read transferring means responsive to said first signal for transferring information on said second bit line to said second input/output terminal.

20. A dynamic semiconductor memory device according to claim 19, which further comprises
a first sense amplifier for amplifying the information on said first bit line, and a second sense amplifier for amplifying the information on said second bit line.

21. A dynamic semiconductor memory device according to claim 20, wherein said first selecting means comprises a first ring pointer for applying in order said first selecting signal to said plurality of first selecting lines, and said second selecting means comprises a second ring pointer for applying in order said second selecting signal to said plurality of second selecting lines.

22. A dynamic semiconductor memory device according to claim 17, wherein said at least one first bit line comprises two first bit lines for every column of said plurality of memory cells, the k-th memory cell (k: odd number) out of said memory cells in each column being connected to one of said two first bit lines and the k-th memory cell (k: even number) out of said memory cells in each column being connected to the other of said two first bit lines, said at least one second bit line comprises two second bit lines for every column of said plurality of memory cells, the k-th memory cell (k: odd number) out of said memory cells in each column being connected to one of said two second bit lines and the k-th memory cell (k: even number) out of said memory cells in each column being connected to the other of said two second bit lines.

23. A dynamic semiconductor memory device comprising a plurality of memory cells, first and second word lines and first and second bit lines, said cells arranged at intersections of said first and second word lines with said first and second bit lines, each said cell comprising a capacitor for storing information, a first transistor having conduction electrodes thereof connected to said first bit line and said capacitor and a control electrode thereof connected to said first word line, and a second transistor having conduction electrodes thereof connected to said second bit line and said capacitor and a control electrode thereof connected to said second word line.

24. A method of operating a dynamic semiconductor memory device comprising a plurality of memory cells, first and second word lines and first and second bit lines, said cells arranged at intersections of said first and second word lines with said first and second bit lines, each said cell comprising a capacitor for storing information, a first transistor having conduction electrodes thereof connected between said first bit line and said capacitor and a control electrode thereof connected to said first word line, and a second transistor having conduction electrodes thereof connected between said second bit line and said capacitor and a control electrode thereof connected to said second word line, an operating method comprising the steps of:

selecting a first or second direction for writing a data signal to said capacitor;

in response to said first writing direction, writing said data signal to said capacitor by applying said data signal to said first bit line while applying a cell selection signal to the first word line to turn on said first transistor;

in response to said second writing direction, writing said data signal to said capacitor by applying said data signal to said second bit line while applying a cell selection signal to the second word line to turn on said second transistor;

selecting a first or second direction for reading a data signal from said compactor;

in response to said first reading direction, reading said data signal from said capacitor by applying a cell selection to said second word line to turn on said second transistor while maintaining said first transistor turned off to transfer said data signal by sharing of charge stored on said capacitor with a capacitance of said second bit line; and in response to said second reading direction, reading said data signal from said capacitor by applying a cell selection to said first word line to turn on said first transistor while maintaining said second transistor turned off to transfer said data signal by sharing of charge stored on said capacitor with a capacitance of said first bit line.

25. A dynamic semiconductor memory device according to claim 13, wherein said first selecting means and said second selecting means comprise ring pointers for applying in order said write selecting signal and said read selecting signal to corresponding one of said plurality of first selecting lines and said plurality of second selecting lines, respectively.

* * * * *